US012742096B2

(12) United States Patent
Han et al.

(10) Patent No.: US 12,742,096 B2
(45) Date of Patent: Sep. 22, 2026

(54) POLISHING COMPOSITION FOR SEMICONDUCTOR PROCESS AND METHOD FOR POLISHING A SUBSTRATE USING THE SAME

(71) Applicant: YCCHEM CO., LTD., Seongju-gun (KR)

(72) Inventors: Deok Su Han, Seoul (KR); Hwan Chul Kim, Seoul (KR); Seung Chul Hong, Seoul (KR); Han Teo Park, Seoul (KR)

(73) Assignee: YCCHEM CO., LTD., Seongju-gun (KR)

( * ) Notice: Subject to any disclaimer, the term of this patent is extended or adjusted under 35 U.S.C. 154(b) by 187 days.

(21) Appl. No.: 18/404,979

(22) Filed: Jan. 5, 2024

(65) Prior Publication Data

US 2024/0274439 A1 Aug. 15, 2024

(30) Foreign Application Priority Data

Feb. 14, 2023 (KR) ........................ 10-2023-0019421

(51) Int. Cl.

| | |
|---|---|
| ***C09G 1/02*** | (2006.01) |
| ***C09G 1/00*** | (2006.01) |
| ***C09G 1/04*** | (2006.01) |
| ***C09K 3/14*** | (2006.01) |
| ***H10P 52/40*** | (2026.01) |
| ***H10P 95/00*** | (2026.01) |

(52) U.S. Cl.

CPC ................. *C09G 1/02* (2013.01); *C09G 1/00* (2013.01); *C09G 1/04* (2013.01); *C09K 3/1409* (2013.01); *C09K 3/1454* (2013.01); *C09K 3/1463* (2013.01); *H10P 52/402* (2026.01); *H10P 52/403* (2026.01); *H10P 95/062* (2026.01)

(58) Field of Classification Search

None

See application file for complete search history.

(56) References Cited

U.S. PATENT DOCUMENTS

| | | | | |
|---|---|---|---|---|
| 9,422,456 | B2 * | 8/2016 | Grumbine ................ | C09G 1/00 |
| 2002/0028636 | A1 | 3/2002 | Koichi et al. | |
| 2013/0309946 | A1 * | 11/2013 | Hamaguchi .......... | C09K 3/1463 451/59 |
| 2021/0301178 | A1 * | 9/2021 | Hains .................. | H01L 21/3212 |

FOREIGN PATENT DOCUMENTS

| | | | |
|---|---|---|---|
| EP | 3 540 761 | A1 | 9/2019 |
| JP | 2001-323254 | A | 11/2001 |
| JP | 2013-140645 | A | 7/2013 |
| JP | 2014-151424 | A | 8/2014 |
| KR | 10-0341141 | B | 6/2002 |
| KR | 10-1406762 | B | 6/2014 |
| KR | 10-2291196 | B | 8/2021 |
| TW | 202031822 | A | 9/2020 |
| TW | I785550 | B | 12/2022 |
| WO | WO 2016/132676 | A | 8/2016 |
| WO | WO 2018/088371 | A | 5/2018 |
| WO | WO 2021/202500 | A | 10/2021 |

OTHER PUBLICATIONS

"Understanding and Interpreting Particle Size Distribution Calculations." Horiba Scientific, Downloaded Jun. 18, 2018.

* cited by examiner

*Primary Examiner* — Jiong-Ping Lu

(74) *Attorney, Agent, or Firm* — NSIP Law

(57) ABSTRACT

A polishing composition for a semiconductor process includes polishing particles. The polishing particles have a Ds value of 700 $nm^2$ to 1400 $nm^2$ according to Equation 1 below;

$$Ds = MPS^2 - D_{10}{}^2 \quad \text{[Equation 1]}$$

In Equation 1, MPS is a mean particle size of primary particles of the polishing particles. $D_{10}$ is a particle diameter at a 10% point on a cumulative curve of a particle size distribution of the primary particles of the polishing particles.

10 Claims, No Drawings

POLISHING COMPOSITION FOR SEMICONDUCTOR PROCESS AND METHOD FOR POLISHING A SUBSTRATE USING THE SAME

CROSS-REFERENCE TO RELATED APPLICATION

This application claims the benefit under 35 U.S.C. 119(a) of Korean Patent Application No. 10-2023-0019421 filed on Feb. 14, 2023, the entire disclosure of which is incorporated herein by reference for all purposes.

BACKGROUND

1. Field

The following description relates to a polishing composition for a semiconductor process, and a method for polishing a substrate using the same.

2. Discussion of Related Art

As semiconductor devices become miniaturized and densified, techniques to form finer patterns are being used, resulting in complex surface structures and increasing gaps between adjacent films. To manufacture semiconductor devices, a chemical mechanical polishing ("CMP") process is used as a planarization technique to remove the gaps in certain films formed on a substrate.

In the CMP process, a substrate is pressurized and rotated while a slurry is provided to a polishing pad to polish its surface. Different stages of the process require different objects to be leveled, and the physical properties of the slurry applied at each stage also vary.

For polishing after forming metal wiring, it is necessary to maintain sufficient polishing rate and sufficient polishing speed while minimizing dishing or erosion.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a polishing composition for a semiconductor process includes polishing particles. The polishing particles have a Ds value of 700 $nm^2$ to 1400 $nm^2$ according to Equation 1 below; [Equation 1] $Ds=MPS^2-D_{10}^2$ In Equation 1, MPS is a mean particle size of primary particles of the polishing particles. $D_{10}$ is a particle diameter at a 10% point on a cumulative curve of a particle size distribution of the primary particles of the polishing particles.

The polishing particles may have a Db value of 500 $nm^2$ to 850 $nm^2$ according to Equation 2 below; [Equation 2] $Db=D_{90}^2-D_{50}^2$ In Equation 2, $D_{90}$ is a particle diameter at a 90% point on the cumulative curve of the particle size distribution of the primary particles of the polishing particles. $D_{50}$ is a particle diameter at a 50% point on the cumulative curve of the particle size distribution of the primary particles of the polishing particles.

The MPS value may be from 25 to 55 nm.

The polishing particles may be concentrated and purified using an ultrafiltration filter.

The ultrafiltration filter may include pores. The pores may have a diameter of from 5 nanometers to 25 nanometers.

A zeta potential of the polishing composition may be from +10 mV to +40 mV.

The polishing composition may include from 0.5 wt % to 10 wt % of the polishing particles.

The polishing particles may include metal oxide particles. The metal oxide particles may include at least one of colloidal silica, fumed silica, ceria, alumina, titania, and zirconia.

A pH of the polishing composition may be from 2 to 5.

In another general aspect, a method of preparing a substrate includes polishing the substrate by applying the polishing composition as a slurry.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terms "approximately" and "substantially" used herein are used at, or in proximity to, numerical values when allowable manufacturing and material tolerances, which are inherent in the meanings, are provided. These terms are used to prevent the unfair use of the disclosures in which correct or absolute values are cited to help in understanding the present disclosure by unscrupulous infringers.

Throughout the specification, the term "combination thereof" included in the Markush-type expression refers to a mixture or combination of one or more selected from the group consisting of constituents described in the Markush-type expression, that is, one or more selected from the group consisting of the components.

Throughout the specification, the description of "A and/or B" means "A, B, or A and B."

Throughout the specification, the terms "first" and "second" or "A," and "B" are used to distinguish identical terms from each other unless specified otherwise.

In the specification, "B is located on A" means that B can be located on A, or B can be located on A with another layer located therebetween, and is not limited to being interpreted as B being located in contact with the surface of A.

In the specification, singular expressions are interpreted to include singular or plural forms as interpreted in the context, unless specified otherwise.

According to the present disclosure, it was experimentally confirmed that it is possible to implement a polishing composition for a semiconductor process, which effectively inhibits the formation of polishing particle-derived defects on a substrate surface to be polished when applied to a CMP process and exhibits excellent polishing properties by controlling a Ds value, which is a parameter related to the particle size distribution of polishing particles, and thus embodiments were completed. Hereinafter, embodiments will be described in detail.

Particle Size Distribution of Polishing Particles

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

A polishing composition for a semiconductor process according to an example may include polishing particles.

The Ds value of the polishing particles according to Equation 1 below is from 700 $nm^2$ to 1400 $nm^2$.

$$Ds = MPS^2 - D_{10}^2 \quad \text{[Equation 1]}$$

In Equation 1, MPS is a mean particle size of primary particles of the polishing particles. $D_{10}$ is a particle diameter at a 10% point on a cumulative curve of a particle size distribution of the primary particles of the polishing particles.

When a wafer surface is polished using a slurry for CMP, a defect caused by polishing particles may be formed on a surface to be polished. The defect may not only be formed by scratches caused by relatively large-sized polishing particles, but also generated by relatively small-sized polishing particles. The relatively small-sized polishing particles have high surface energy and thus may be strongly adsorbed to the surface to be polished. In addition, the adsorbed particles may have a characteristic of easily bonding with an organic material, causing a problem of the organic material remaining on a wafer surface. These polishing particles are not easily removed even by a cleaning process.

According to the present disclosure, the generation of defects on the surface to be polished may be effectively inhibited by controlling the Ds value of the polishing particles. In this case, the number of polishing particles having a diameter small enough to being easily adsorbed to the surface to be polished among the polishing particles may be controlled within a predetermined range in the present disclosure, so the generation of defects on the wafer surface may be effectively inhibited.

The MPS value and $D_{10}$ value of the polishing particles were measured by dynamic light scattering (DLS) using a particle size measuring instrument. For example, the above values may be measured with Nano-ZS equipment (Malvern).

The Ds value is calculated from the measured MPS and $D_{10}$ values.

The Ds value of the polishing particles may be from 700 $nm^2$ to 1400 $nm^2$. The Ds value may be 800 $nm^2$ or more. The Ds value may be 900 $nm^2$ or more. The Ds value may be 1000 $nm^2$ or more. The Ds value may be 1100 $nm^2$ or more. The Ds value may be 1200 $nm^2$ or more. The Ds value may be 1380 $nm^2$ or less. The Ds value may be 1370 $nm^2$ or less. When such a polishing composition is applied to the CMP process, the generation of defects on the wafer surface caused by the adsorption of the polishing particles may be effectively inhibited.

The Db value of the polishing particles according to Equation 2 below may be from 500 $nm^2$ to 850 $nm^2$.

$$Db = D_{90}^2 - D_{50}^2 \quad \text{[Equation 2]}$$

In Equation 2, $D_{90}$ is a particle diameter at a 90% point on the cumulative curve of the particle size distribution of the primary particles of the polishing particles.

$D_{50}$ is a particle diameter at a 50% point on the cumulative curve of the particle size distribution of the primary particles of the polishing particles.

In the present disclosure, the Db value of the polishing particles may be controlled. Therefore, the frequency of defects, such as scratches, caused by polishing particles on the substrate to be polished may be effectively reduced in the CMP process.

The $D_{90}$ and $D_{50}$ values of the polishing particles are measured by DLS using a particle size measuring instrument. As an example, the above values may be measured with Nano-ZS equipment (Malvern).

The Db value is calculated from the measured $D_{90}$ and $D_{50}$ values.

The Db value of the polishing particles may be from 500 $nm^2$ to 850 $nm^2$. The Db value may be 600 $nm^2$ or more. The Db value may be 650 $nm^2$ or more. The Db value may be 700 $nm^2$ or more. The Db value may be 750 $nm^2$ or more. The Db value may be 820 $nm^2$ or less. The Db value may be 800 $nm^2$ or less. In this case, the number of polishing particles with an excessively large diameter may be controlled to effectively lower the frequency of scratches on the surface to be polished.

The MPS value of the polishing particles may be from 25 nm to 55 nm. The MPS value may be 50 nm or less. The MPS value may be 45 nm or less. The MPS value may be 43.5 nm or less. The MPS value may be 30 nm or more. The MPS value may be 35 nm or more. The MPS value may be 40 nm or more.

The $D_{50}$ value of the polishing particles may be 35 nm to 51 nm. The $D_{50}$ value may be 38 nm or more. The $D_{50}$ value may be 40 nm or more. The $D_{50}$ value may be 42 nm or more. The $D_{50}$ value may be 50 nm or less.

The $D_{90}$ value of the polishing particles may be 45 nm to 56 nm. The $D_{90}$ value may be 48 nm or more. The $D_{90}$ value may be 50 nm or more.

When such a polishing composition is applied to the CMP process, an excellent polishing rate may be achieved while reducing the degree of scratch formation on the polished surface.

The $D_{10}$ value of the polishing particles may be from 15 nm to 35 nm. The $D_{10}$ value may be 18 nm or more. The $D_{10}$ value may be 20 nm or more. The $D_{10}$ value may be 22 nm or more. The $D_{10}$ value may be 32 nm or less. The $D_{10}$ value may be 30 nm or less. The $D_{10}$ value may be 28 nm or less. In this case, the frequency with which the polishing particles are adhered to the substrate surface during the CMP process may be reduced.

The polishing particles may be concentrated and purified using an ultrafiltration filter.

The ultrafiltration filter may have pores. The pores may have a diameter of from 5 nm to 25 nm.

The description of the concentration and purification of the polishing particles using an ultrafiltration filter is omitted as it overlaps with the content to be described later.

Composition of Polishing Particles

Polishing particles may include metal oxide particles. The metal oxide particles may include at least one of colloidal silica, fumed silica, ceria, alumina, titania, and zirconia. As an example, the metal oxide particles may be colloidal silica.

To control the affinity between a surface to be polished and the polishing particles and improve a polishing rate, a polishing composition for a semiconductor process may include surface-modified metal oxide particles as polishing particles. Particularly, in an example, polishing particles including metal oxide particles which are surface-modified by a silane-based compound having an amine group or ureido group may be applied. Accordingly, the electrostatic repulsion between the polishing particles and a silicon oxide film may be reduced, and the excessive adsorption of the polishing particles to a substrate surface may also be inhibited.

The polishing particles may include metal oxide particles that are surface-modified by an amino silane. As the polishing particles, metal oxide particles that are surface-modified by an amino silane may be applied. The amino silane may be, for example, any one selected from the group consisting of aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyl)propyl]-1,2-ethylenediamine, N-[3-(triethoxysilyl)propyl]ethylenediamine, diethylene triaminopropyl trimethoxysilane, diethylene triaminopropylmethyl dimethoxysilane, diethylene aminomethyl triethoxysilane, diethyl aminopropyl trimethoxysilane, diethylaminopropyl triethoxysilane, dimethylaminopropyl trimethoxysilane, N-[3-(trimethoxysilyl)propyl]butylamine, and a combination thereof.

The polishing particles may include metal oxide particles that are surface-modified by an ureido silane. As the polishing particles, metal oxide particles that are surface-modified by an ureido silane may be applied. The ureido silane may be, for example, any one selected from the group consisting of 3-ureidotrimethoxysillane, ureidopropyltriethoxysillane, and a combination thereof.

The polishing particles may include from 1 part to 10 parts by weight of a silane-based compound having an amine group or an ureido group, based on 100 parts by weight of the metal oxide particles. The polishing particles may include from 3 parts to 8 parts by weight of a silane-based compound having an amine group or an ureido group based on 100 parts by weight of the metal oxide particles. In this case, the polishing properties of the polishing composition for a silicon oxide layer may be effectively improved.

Composition and Physical Properties of Polishing Composition for Semiconductor Process A polishing composition for a semiconductor process may include from 0.5 wt % to 10 wt % of polishing particles. The polishing composition for a semiconductor process may include 1 wt % or more of polishing particles. The polishing composition for a semiconductor process may include 1.5 wt % or more of polishing particles. The polishing composition for a semiconductor process may include 2 wt % or more of polishing particles. The polishing composition for a semiconductor process may include 8 wt % or less of polishing particles. The polishing composition for a semiconductor process may include 6 wt % or less of polishing particles. Such a polishing composition may help reduce the frequency of defects in the polishing process while stably dispersing the polishing particles within the composition.

The polishing composition for a semiconductor process may further include an additive. The additive is not limited as long as it is typically applied to the CMP field. For example, the additive may be at least one of a non-ionic polymer, a chelating agent, an oxidant, an acid component, a pH adjuster, a dispersant, a polishing rate enhancer, a polishing modifier, a polishing pad protector, and a preservative.

The polishing composition for a semiconductor process may further include a non-ionic polymer to further improve the dispersity of the polishing particles in the polishing composition. Specifically, a non-ionic polymer included in the polishing composition may be adsorbed to the polishing particles, increasing the dispersity of the polishing particles. In addition, since a non-ionic polymer, which is not adsorbed to the polishing particles, has a steric hindrance effect, the dispersion stability of the polishing particles may be further increased. Particularly, the non-ionic polymer ensures the polishing composition for a semiconductor process to have more stable dispersion stability even in an acidic environment. Such a non-ionic polymer may reduce the generation of defects caused by polishing on a substrate during the polishing process.

The non-ionic polymer may be at least any one selected from the group consisting of polyethylene glycol, polypropylene glycol, polyvinylpyrrolidone, polyethylene oxide, polypropylene oxide, polyalkyloxides, polyoxyethylene oxide, a polyethylene oxide-propylene oxide copolymer, cellulose, methylcellulose, methylhydroxyethylcellulose, methylhydroxypropylcellulose, hydroxyethylcellulose, carboxymethylcellulose, carbxoymethylhydroxyethylcellulose, sulfoethylcellulose, and carboxymethylsulfoethylcellulose.

The non-ionic polymer may have a weight average molecular weight of less than 25,000 g/mol. The weight average molecular weight may be 1,000 g/mol or more and less than 25,000 g/mol. In this case, the non-ionic polymer may exhibit excellent solubility, and may further improve the dispersion stability of the polishing particles.

The polishing composition for a semiconductor process may include 0.01 wt % to 5 wt % of the non-ionic polymer. The polishing composition for a semiconductor process may include more than 0.1 wt % non-ionic polymer. The polishing composition for a semiconductor process may include 2 wt % or less of the non-ionic polymer. In this case, the polishing composition may help reduce the frequency of defects generated on the surface of the polished substrate and inhibit contamination, such as re-adhesion of particles on the surface.

The polishing composition for a semiconductor process may further include a chelating agent. A metal or metal ions that are removed from the substrate surface through the polishing process are very likely to reattach or remain on the substrate surface, thus forming defects. Particularly, a metal such as tungsten may be easily dissolved in the polishing composition under specific conditions, but may have a property of easily adhering to the surface to be polished. The chelating agent may be adhered to such a metal or metal ions to easily remove the metal or the like. Accordingly, the polishing rate of the polishing composition may be further increased, and the formation of defects on the substrate surface due to particle reattachment may be effectively inhibited.

In an example, the chelating agent may be at least one selected from the group consisting of butyric acid, citric acid, tartaric acid, succinic acid, oxalic acid, acetic acid, adipic acid, capric acid, caproic acid, caprylic acid, carboxylic acids, glutaric acid, glutamic acid, glycolic acid, thioglycolic acid, formic acid, mandelic acid, fumaric acid, lactic acid, lauric acid, malic acid, maleic acid, malonic acid, myristic acid, plamitic acid, phthalic acid, isophthalic acid, terephthalic acid, citraconic acid, propionic acid, pyruvic acid, stearic acid, valeric acid, benzoic acid, phenylacetic acid, naphthoic acid, aspartic acid, amino acids, and ethylenediaminetetraacetic acid.

As the amino acid, glycine, α-alanine, β-alanine, L-aspartic acid, N-methylglycine, and a combination thereof may be applied.

The chelating agent may include two or more carboxyl groups or alcohol groups in its molecule. As the chelating agent, two or more types of chelating agents, each including two or more carboxyl groups or alcohol groups in its molecule may be applied. Specifically, the chelating agent may include any one selected from the group consisting of ethylenediaminetetraacetic acid (EDTA), glycine, carboxylic acids, and a combination thereof. The carboxylic acid refers to a compound that includes one or two or more carboxyl groups in its molecule.

The polishing composition for a semiconductor process may include from 0.003 wt % to 0.5 wt % of the chelating agent. The polishing composition for a semiconductor process may include 0.005 wt % or more of the chelating agent. The polishing composition for a semiconductor process may include 0.3 wt % or less of the chelating agent. In this case, the polishing rate of the polishing composition may be controlled to an appropriate level, and the frequency of defects on the substrate surface may be reduced.

The polishing composition for a semiconductor process may further include an oxidant. The oxidant oxidizes a metal such as tungsten, creating an environment in which the substrate surface may be more easily planarized, and serves to improve polishing and etching rates.

The oxidant may be at least one selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium persulfate, benzoyl peroxide, calcium peroxide, barium peroxide, sodium peroxide, and urea peroxide.

The polishing composition for a semiconductor process may include 0.01 wt % to 5 wt % of the oxidant. In this case, the composition may exhibit excellent polishing properties for the metal, and inhibit the formation of an oxide film on the metal to be polished during the polishing process.

The polishing composition for a semiconductor process may be an acidic solution. Specifically, the pH of the polishing composition for a semiconductor process may be from 2 to 5. The pH may be 3 or more. The pH may be 4.5 or less. In this case, a polishing rate and quality may be maintained at an excellent level while preventing excessive corrosion of the metal component on the surface of the substrate to be polished or a polishing device.

The polishing composition for a semiconductor process may further include an acidic component. The acidic component may be, for example, at least one selected from the group consisting of hydrochloric acid, phosphoric acid, sulfuric acid, hydrofluoric acid, hydrobromic acid, iodic acid, formic acid, malonic acid, maleic acid, oxalic acid, acetic acid, adipic acid, citric acid, adipic acid, propionic acid, fumaric acid, lactic acid, salicylic acid, pimelic acid, benzoic acid, succinic acid, phthalic acid, butyric acid, glutaric acid, glutamic acid, glycolic acid, aspartic acid, tartaric acid, and a salt thereof.

The polishing composition for a semiconductor process may further include a pH adjuster in addition to the acidic component. The pH adjuster may be any one selected from the group consisting of, for example, ammonia, aminomethylpropanol, tetramethylammonium hydroxide, potassium hydroxide, sodium hydroxide, magnesium hydroxide, rubidium hydroxide, cesium hydroxide, sodium bicarbonate, sodium carbonate, imidazole, and a combination thereof.

The polishing composition for a semiconductor process may further include a dispersant.

The dispersant may prevent agglomeration between polishing particles and uniformly disperse the polishing particles in the polishing composition. A cationic dispersant may increase the zeta potential of the polishing composition, and an anionic ion-based dispersant may decrease the zeta potential of the polishing composition.

The dispersant may include an anionic small molecule, a cationic polymer, and an organic acid.

The anionic small molecule of the dispersant may be one or more selected from oxalic acid, citric acid, polysulfonic acid, polyacrylic acid, polymethacrylic acid, and a combination thereof.

The cationic polymer of the dispersant may be one or more selected from polylysine, polyethyleneimine, benzethonium chloride, bronidox, cetrimonium bromide, cetrimonium chloride, dimethyldeoctadecyl ammonium chloride, tetramethylammonium hydroxide, distearyldimethylammonium chloride, polyaryl amines, and a combination thereof.

The organic acid of the dispersant may be one or more selected from hydroxybenzoic acid, ascorbic acid, picolinic acid, glutamic acid, tryptophan, aminobutyric acid, and a combination thereof.

The polishing rate enhancer may be an additive for increasing a polishing rate of the substrate or wiring to be polished, and may be one or more selected from potassium nitrate, iron nitrate, ammonium hydroxide, citric acid, acetic acid, and a combination thereof.

The polishing modifier is intended to minimize the adsorption of the polishing composition on a metal surface, and may include an ammonium compound, potassium nitrate, an amino acid, and a salt thereof.

The polishing composition for a semiconductor process may include a solvent. The solvent may be water, and specifically, ultrapure water.

The polishing composition for a semiconductor process may have a zeta potential of +10 mV to +40 mV. The zeta potential value may be greater than or equal to +20 mV. The zeta potential value may be +22 mV or more. The zeta potential value may be +35 mV or less. The zeta potential value may be +26 mV or less. In this case, by controlling the affinity of the polishing composition to the surface of the substrate to be polished, it is possible to provide a polishing composition in which the degree of adsorption of polishing particles to the surface to be polished is controlled to a certain level or less while excellent polishing properties are exhibited.

The zeta potential value of the polishing composition is measured using a zeta potential measuring device.

Polishing Properties of Polishing Composition for Semiconductor Process

The polishing composition for a semiconductor process may be applied to the polishing of a silicon oxide film. The polishing composition for a semiconductor process may be applied to the polishing of a substrate surface where a silicon oxide film and tungsten wiring are exposed. The polishing composition for a semiconductor process may be applied to the polishing of a substrate surface where a silicon oxide film, tungsten wiring, and a titanium layer are exposed.

The polishing rate of the polishing composition for a semiconductor process to the silicon oxide film may be 1350 Å/min or more. The polishing rate may be 1450 Å/min or more. The polishing rate may be 1550 Å/min or more. The polishing rate may be 1650 Å/min or more. The polishing rate may be 3500 Å/min or less. The polishing rate may be 3000 Å/min or less. The polishing rate may be 2500 Å/min or less.

The polishing rate for the silicon oxide film is measured under the conditions of a pressure of 2.2 psi, a carrier speed of 103 rpm, a platen speed of 57 rpm, and a slurry flow rate of 300 mL/min.

The $PI_S$ value of the polishing composition for a semiconductor process according to Equation 3 below may be 380 Å/(min·wt %) to 800 Å/(min·wt %).

$$PI_S = \frac{P_S}{C} \quad \text{[Equation 3]}$$

In Equation 3, $P_S$ is a polishing rate (units: Å/min) of the polishing composition for a semiconductor process for the silicon oxide film.

C is a content (units: wt %) of polishing particles in the polishing composition for a semiconductor process.

The $PI_S$ value may be 400 Å/(min·wt %) or more. The $PI_S$ value may be 450 Å/(min·wt %) or more. The $PI_S$ value may be 500 Å/(min·wt %) or more. The $PI_S$ value may be 550 Å/(min·wt %) or more. The $PI_S$ value may be 700 Å/(min·wt %) or less. The $PI_S$ value may be 600 Å/(min·wt %) or less.

Such a polishing composition may exhibit stable polishing properties for silicon oxide films.

The polishing rate of the polishing composition for a semiconductor process for tungsten may be 150 Å/min or more. The polishing rate may be 180 Å/min or more. The polishing rate may be 200 Å/min or more. The polishing rate may be 250 Å/min or more. The polishing rate may be 400 Å/min or less.

The polishing rate for tungsten is measured under the conditions of a pressure of 2.2 psi, a carrier speed of 63 rpm, a platen speed of 57 rpm, and a slurry flow rate of 300 mL/min.

The $PI_W$ value of the polishing composition for a semiconductor process according to Equation 4 below may be 45 Å/(min·wt %) to 100 Å/(min·wt %).

$$PI_w = \frac{P_w}{C} \quad \text{[Equation 4]}$$

In Equation 4, Pw is a polishing rate (units: Å/min) of the polishing composition for a semiconductor process for tungsten.

C is a content (units: wt %) of polishing particles in the polishing composition for a semiconductor process.

The $PI_W$ value may be 50 Å/(min·wt %) or more. The $PI_W$ value may be 55 Å/(min·wt %) or more. The $PI_W$ value may be 60 Å/(min·wt %) or more. The $PI_W$ value may be 90 Å/(min·wt %) or less. The $PI_W$ value may be 80 Å/(min·wt %) or less. The $PI_W$ value may be 75 Å/(min·wt %) or less.

Such a polishing composition may exhibit excellent polishing properties while inhibiting excessive defects generated on the substrate surface when applied to tungsten polishing.

Method of Preparing Polishing Composition for Semiconductor Process

A method of preparing a polishing composition for a semiconductor process according to the present disclosure includes a step of controlling the particle size distribution, which is controlling a particle size distribution of polishing particles before purification (i.e., pre-purification polishing particles) to prepare a polishing particles after purification (i.e., post-purification polishing particles), and a step of manufacturing, which is preparing a polishing composition for a semiconductor process including the post-purification polishing particles.

In the step of controlling the particle size distribution, polishing particles whose particle size distribution is controlled by precisely removing at least a part of the polishing particles with a diameter below a certain level may be prepared. Accordingly, polishing particles with small diameters, which do not participate in polishing, may be more effectively prevented from being adsorbed to the substrate surface and generating defects.

As a method for removing polishing particles with diameters below a certain level from the polishing particles, a purification process using a filter and a centrifuging process may be applied.

The polishing particles may be concentrated and purified using a filter with pores. Specifically, after preparing a mixture by mixing the polishing particles in a solvent, the mixture may be concentrated and purified by allowing polishing particles with diameters smaller than the pores in the mixture and a solvent to pass through the filter. Accordingly, the polishing particles having a size smaller than the pores may be effectively removed, thereby reducing the frequency of occurrence of defects on the substrate surface caused by the polishing particles.

The filter may have any one form of hollow fiber, a flat plate, and a tube. Particularly, a hollow fiber-type filter may be applied to the embodiment.

The filter may be an ultrafiltration filter. The ultrafiltration filter is a separator having pores with a diameter of 1 nm to 50 nm.

The pores of the ultrafiltration filter may have a diameter of from 5 nm to 25 nm. The diameter may be 10 nm or more. The diameter may be 20 nm or less.

The molecular weight cut-off (MWCO) of the ultrafiltration filter may be 300 to 300,000 Dalton or more. The MWCO may be 1,000 Dalton or more. The MWCO may be 10,000 Dalton or more. The MWCO may be 50,000 Dalton or more. The MWCO may be 100,000 Dalton or more. The MWCO may be 150,000 Dalton or more. The MWCO may be 280,000 Dalton or more. The MWCO is the minimum molecular weight of a solute that exhibits a degree of exclusion of 90% or more by the separator.

In this case, a considerable amount of the polishing particles that tend to easily remain on the substrate surface may be effectively removed.

The ultrafiltration filter is not limited as long as it is commonly used in the field of ultrafiltration filter. For example, the ultrafiltration filter may be at least one of the filters made of a polyacrylonitrile separator, a polyvinylidene fluoride separator, a polysulfone separator, a polyethersulfone separator, a cellulose acetate separator, a cellulose nitrate separator, and a copolymer thereof.

The purification of the polishing particles through the ultrafiltration filter may be performed once or in a plurality of times. In particular, when the purification of the polishing particles through the ultrafiltration filter is performed plural times, the number of defects generated on the surface of the substrate to be polished may be reduced more effectively.

In this case, it may be easy to control the particle size distribution of the polishing particles within a preset range in the present disclosure. At the same time, it may effectively remove foreign materials such as floating materials or polymeric materials included along with the polishing particles, and various species of bacteria and viruses.

By centrifugation, post-purification polishing particles may be prepared by purifying the pre-purification polishing particles. The centrifugation may be performed at a speed of 5,000 rpm to 30,000 rpm. The speed may be 25,000 rpm or less. The speed may be 20,000 rpm or less. The speed may be 15,000 rpm or less. The speed may be 12,000 rpm or less. The speed may be 8,000 rpm or less. Accordingly, the particle size distribution of the purified polishing particles may be effectively adjusted.

The purification of the polishing particles through centrifugation may be performed once or plural times.

The step of controlling the particle size distribution may be performed before the pre-purification polishing particles are mixed with additives in a solvent. The process of purifying the polishing particles may be implemented while mixing the polishing particles with additives in a solvent.

The description of the particle size distribution, composition, and physical properties of the post-purification polishing particles overlaps with previous content and thus will be omitted.

In the manufacturing step, the polishing composition for a semiconductor process may include post-purification polishing particles and a solvent. The polishing composition for a semiconductor process may further include additives in addition to the post-purification polishing particles and the solvent.

The description of the content of the post-purification polishing particles, the type of solvent, the type and content of additive in the polishing composition for a semiconductor process overlaps with previous content and thus is omitted.

In the step of controlling the particle size distribution, when the pre-purification polishing particles are not mixed with the additives in the solvent, in the manufacturing step, a polishing composition for a semiconductor process may be prepared by adding and mixing the post-purification polishing particles and the additives in the solvent. For the method of adding and mixing the polishing particles and the additive in the solvent, a usually applied method in the CMP field may be applied.

Method of Preparing Substrate

A method of preparing a substrate according to an present disclosure includes polishing the substrate by applying a polishing composition for a semiconductor process as a slurry.

The substrate may include at least one of an insulating film, a metal wiring, and a barrier layer on a top surface. The metal wiring may include copper or tungsten. When the metal wiring includes copper, the barrier layer may include tantalum and a nitride thereof. When the metal wiring includes tungsten, the barrier layer may include titanium and a nitride thereof.

Specifically, the process of polishing a substrate may be implemented by bringing the substrate to be polished into contact with a polishing pad with a polishing composition for a semiconductor process supplied from an injection nozzle and rotating a polishing head fixing the substrate and a plate to which the polishing pad is attached.

The process of polishing a substrate may further include conditioning the surface of the polishing pad before polishing, if necessary.

The polishing composition for a semiconductor process may polish a wafer in contact with the polishing pad while penetrating into the substrate.

In the process of polishing the substrate, a pressure of 6.89 kPa to 48.26 kPa may be applied. The pressure may be 13.79 kPa to 34.47 kPa.

The process of polishing the substrate may be performed for 50 seconds to 10 minutes. However, the time for the process may depend on an intended degree of polishing.

The description of the polishing composition for a semiconductor process overlaps with previous content and thus is omitted.

The method of preparing a substrate may further include cleaning the polished substrate.

The cleaning process may be implemented by cleaning the polished substrate with purified water and an inert gas.

Hereinafter, specific embodiments will be described in more detail. The following examples are merely provided to help understand the present disclosure, and the scope of the present disclosure is not limited thereto.

Preparation Example: Preparation of Polishing Composition

Example 1: As pre-purification polishing particles, colloidal silica was prepared. The pre-purification polishing particles were surface-modified with an amino silane, such as (3-aminopropyl)triethoxysilane (99%, Sigma Aldrich). The $D_{50}$ of the surface-modified pre-purification polishing particles was measured to be 44 nm to 46 nm.

The surface-modified polishing particles were then added to ultrapure water to prepare a mixture containing 5 wt % of the pre-purification polishing particles. This mixture was concentrated once by purification using a UF filter (MWCO: 200,000 Dalton, Synopex) to prepare post-purification polishing particles. The concentration was performed until the content of the pre-purification polishing particles in the mixture reached 30 wt %.

Post-purification polishing particles, a 30 wt % sorbitol-containing polishing pad protector GC-30 (Yunwoo Chemical) and benzisothiazolinone BNO-B-3 (BNO Chem) were added to the ultrapure water and mixed, thereby preparing a polishing composition. For benzisothiazolinone, 3 wt % dilution containing ultrapure water as a solvent was added. In the polishing composition, the content of the post-purification polishing particles was 3 wt %, the content of sorbitol was 2 wt %, and the content of benzisothiazolinone was 0.01 wt %. The zeta potential of the polishing composition was measured to be +20 mV to +25 mV.

Example 2: A polishing composition was prepared under the same conditions as in Example 1, except that polishing particles obtained by performing the purification process used in Example 1 twice were applied as post-purification polishing particles.

Example 3: A polishing composition was prepared under the same conditions as in Example 2, except that the content of post-purification polishing particles in the polishing composition was 5 wt %.

Comparative Example 1: A polishing composition was prepared under the same conditions as in Example 1, except that polishing particles that did not undergo a purification process were applied to the polishing composition.

Comparative Example 2: A polishing composition was prepared under the same conditions as in Comparative Example 1, except that the content of polishing particles in the polishing composition was 5 wt %.

Process conditions for each Example and Comparative Example are listed in Table 1 below.

Evaluation Example: Measurement of Particle Size Distribution of Polishing Particles The MPS, $D_{10}$, $D_{50}$, and $D_{90}$ of the polishing particles in the polishing composition of each Example and Comparative Example were measured using Nano-ZS equipment (Malvern). Afterward, the Ds and Db values were calculated from the measured values.

The measured and calculated values for each Example and Comparative Example are listed in Table 2 below.

Evaluation Example: Measurement of Polishing Rate

The polishing composition of each Example and Comparative Example was applied as a slurry to measure a polishing rate for a silicon oxide film with a thickness of 20,000 Å, formed on a wafer having a diameter of 300 mm.

The polishing rate for the silicon oxide film was measured under the conditions of a polishing time of 60 seconds, a pressure of 2.2 psi, a carrier speed of 103 rpm, a platen speed of 57 rpm, and a slurry flow rate of 300 mL/min.

In addition, the polishing composition of each Example and Comparative Example was applied as a slurry to measure a polishing rate for a tungsten film having a thickness of 650 Å, formed on a wafer having a diameter of 300 mm. The polishing rate for the tungsten film was measured under the conditions of a polishing time of 15 seconds, a pressure of 2.2 psi, a carrier speed of 63 rpm, a platen speed of 57 rpm, and a slurry flow rate of 300 mL/min.

Measured values of each Example and Comparative Example are listed in Table 3 below.

Evaluation Example: Measurement of Defects on Surface of Substrate to be Polished The polishing composition of each Example and Comparative Example was applied as a slurry to polish each of the silicon oxide film and the tungsten film on the wafer. The measurement conditions were the same as those applied in the previous evaluation of the polishing rate measurement.

A cleaning process was performed on the polished silicon oxide and tungsten films under the conditions of a brush rotation speed of 500 rpm and a chemical injection rate of 2,000 cc/min. As chemicals, ammonium hydroxide and hydrofluoric acid dilution products (SIC) were applied.

After sealing the cleaned wafer of each Example and Comparative Example in a wafer FOUP, the total number of defects formed on the top surface of each of the silicon oxide and tungsten films was measured using AIT-XP+ equipment.

The measurement results for each of the Example and Comparative Example are listed in Table 3 below.

TABLE 1

| | Number of purifications of polishing particles (times) | Content of polishing particles in polishing composition (wt %) |
|---|---|---|
| Example 1 | 1 | 3 |
| Example 2 | 2 | 3 |
| Example 3 | 2 | 5 |
| Comparative Example 1 | 0 | 3 |
| Comparative Example 2 | 0 | 5 |

TABLE 2

| | MPS(nm) | $D_{10}$(nm) | $D_{50}$(nm) | $D_{90}$(nm) | Ds($nm^2$) | Db($nm^2$) |
|---|---|---|---|---|---|---|
| Example 1 | 43.41 | 25.85 | 46.60 | 53.65 | 1216.21 | 706.76 |
| Example 2 | 42.35 | 25.35 | 45.50 | 52.10 | 1150.90 | 644.16 |
| Example 3 | 44.90 | 25.65 | 47.60 | 55.30 | 1358.09 | 792.33 |
| Comparative Example 1 | 45.36 | 25.38 | 45.40 | 54.20 | 1413.39 | 876.48 |
| Comparative Example 2 | 45.70 | 25.50 | 48.43 | 56.80 | 1438.24 | 880.78 |

TABLE 3

| | Polishing rate for silicon oxide film (Å/min) | Polishing rate for tungsten film (Å/min) | Number of defects on silicon oxide film | Number of defects on tungsten film |
|---|---|---|---|---|
| Example 1 | 1715 | 196 | 486 | 41 |
| Example 2 | 1722 | 197 | 367 | 32 |
| Example 3 | 2111 | 275 | 368 | 37 |
| Comparative Example 1 | 1106 | 205 | 1039 | 101 |
| Comparative Example 2 | 1293 | 250 | 1106 | 124 |

In Table 3, the number of defects on the silicon oxide film, measured in Examples 1 to 3, was less than 500, whereas the number of defects on the silicon oxide film, measured in Comparative Examples 1 and 2, was 1,000 or more.

In addition, the number of defects on the tungsten film, measured in Examples 1 to 3, was less than 50, whereas the number of defects on the tungsten film, measured in Comparative Examples 1 and 2, was 100 or more.

The polishing rate for the silicon oxide film measured in Examples 1 to 3, was higher than those of Comparative Examples 1 and 2, and the polishing rate for the tungsten film measured in Examples 1 to 3 was close to the values measured in Comparative Examples 1 and 2. That is, Examples 1 to 3 exhibited stable polishing properties in both the silicon oxide film and the tungsten film.

The polishing composition for a semiconductor process according to one embodiment can effectively inhibit the formation of a polishing particle-derived defect on a substrate surface to be polished when applied to a CMP process and exhibit stable polishing properties.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A polishing composition for a semiconductor process, the polishing composition comprising:

polishing particles, wherein the polishing particles have a Ds value of 700 $nm^2$ to 1400 $nm^2$ according to Equation 1 below, the Ds value being calculated from a mean particle size (MPS) and a $D_{10}$ value of primary particles measured by dynamic light scattering (DLS):

$$Ds = MPS^2 - D_{10}{}^2 \quad \text{[Equation 1]}$$

In Equation 1, MPS is a mean particle size of primary particles of the polishing particles, and $D_{10}$ is a particle diameter at a 10% point on a cumulative curve of a particle size distribution of the primary particles of the polishing particles, and wherein the polishing particles have a Doo value of 45 nm to 56 nm.

2. The polishing composition of claim 1, wherein the polishing particles have a Db value of 500 $nm^2$ to 850 $nm^2$ according to Equation 2 below;

$$Db = D_{90}{}^2 - D_{50}{}^2 \quad \text{[Equation 2]}$$

In Equation 2, $D_{90}$ is a particle diameter at a 90% point on the cumulative curve of the particle size distribution of the primary particles of the polishing particles, and $D_{50}$ is a particle diameter at a 50% point on the cumulative curve of the particle size distribution of the primary particles of the polishing particles.

3. The polishing composition of claim 1, wherein the MPS value is from 25 nm to 55 nm.

4. The polishing composition of claim 1, wherein the polishing particles are concentrated and purified using an ultrafiltration filter.

5. The polishing composition of claim 4, wherein the ultrafiltration filter comprises pores having a diameter of from 5 nanometers to 25 nanometers.

6. The polishing composition of claim 1, wherein a zeta potential of the polishing composition is from +10 mV to +40 mV.

7. The polishing composition of claim 1, wherein the polishing composition comprises from 0.5 wt % to 10 wt % of the polishing particles.

8. The polishing composition of claim 1, wherein the polishing particles comprise metal oxide particles, and wherein the metal oxide particles comprise at least one of colloidal silica, fumed silica, ceria, alumina, titania, and zirconia.

9. The polishing composition of claim 1, wherein a pH of the polishing composition is from 2 to 5.

10. A method of preparing a substrate, the method comprising:

polishing the substrate by applying the polishing composition of claim 1 as a slurry.

* * * * *